United States Patent [19]

Mullally

[11] 4,184,125
[45] Jan. 15, 1980

[54] ANALOG TUNING VOLTAGE CIRCUIT WITH ANALOG SIGNAL MULTIPLEXING

[75] Inventor: James F. Mullally, Apalachin, N.Y.

[73] Assignee: The United States of America as represented by the Secretary of the Air Force, Washington, D.C.

[21] Appl. No.: 922,601

[22] Filed: Jul. 7, 1978

[51] Int. Cl.² .............................................. H03G 3/00
[52] U.S. Cl. ..................................... 330/282; 330/51; 330/84; 330/86; 330/295
[58] Field of Search .................... 330/51, 84, 86, 110, 330/282, 295; 328/103, 154

[56] References Cited

U.S. PATENT DOCUMENTS

| | | | |
|---|---|---|---|
| 3,355,670 | 11/1967 | Pastoriza | 330/86 UX |
| 3,500,316 | 3/1970 | Brown | 330/86 |
| 3,622,904 | 11/1971 | Knight | 330/51 X |
| 3,662,275 | 5/1972 | Riley | 330/51 X |

*Primary Examiner*—James B. Mullins
*Attorney, Agent, or Firm*—Joseph E. Rusz; Robert Kern Duncan

[57] ABSTRACT

Disclosed is an analog tuning circuit, suitable for multiplexing, having a field-effect transistor connected to the output of an operational amplifier with the drain connected in a feedback loop to the inverting input of the amplifier.

1 Claim, 4 Drawing Figures

ANALOG TUNING VOLTAGE CIRCUIT WITH ANALOG SIGNAL MULTIPLEXING

RIGHTS OF THE GOVERNMENT

The invention described herein may be manufactured and used by or for the Government of the United States for all governmental purposes without the payment of any royalty.

BACKGROUND OF THE INVENTION

The field of the invention is in digital to analog converters, and more particularly in that of providing an analog tuning voltage with multiplexing.

Many modern communication devices such as radio receivers use an electronic frequency synthesizer having a digitally controlled analog voltage in a VCO (voltage controlled oscillator) circuit for tuning. The need for more stable, accurate, and less space consuming circuits has been well recognized.

The best known prior art is that contained in U.S. Pat. No. 3,624,530 to patentee Zwirn; U.S. Pat. No. 3,904,977 to patentee Barsotti; and U.S. Pat. No. 4,015,192 to patentee Koyanagi; and the article "CMOS Analog switches can precisely control a op-amp's gain", by Gordon L. Wong appearing in Electronic Design 10, May 10, 1976.

SUMMARY OF THE INVENTION

An analog tuning voltage circuit is disclosed that has improved accuracy and stability, and yet occupies only one-third the space of the prior art devices.

DESCRIPTION OF THE PREFERRED EMBODIMENT

Figure 1:
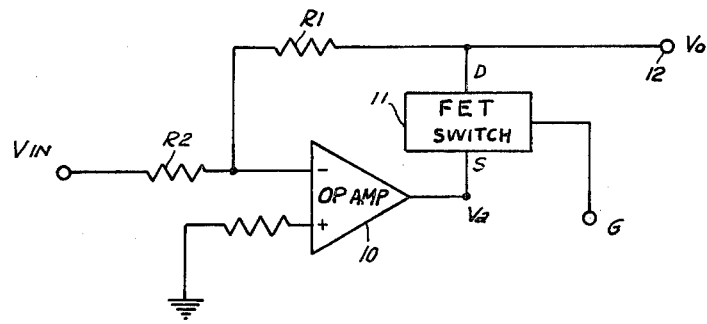
FIG. 1 schematically illustrates in simplified form a FET gain controlled operational amplifier tuning circuit suitable for multiplexing.

As shown in FIG. 1, the analog tuning circuit comprises operational amplifier 10 and field-effect transistor (FET) switch 11, with the source connected to the output of the amplifier and the drain connected in a feedback loop through resistor R1 to the inverting input of the amplifier. The output signal $V_O$ is taken from terminal 12, thereby eliminating any error contributed by the temperature-dependent impedance drift of the FET switch 11. This is illustrated by the following mathematical expressions for the circuit of FIG. 1, assuming an ideal amplifier.

$$V_a = (R_f/R_{in})V_{in} \quad (1)$$

when $R_f = r_{ON} + R_1$, $R_{in} = R_2$ and $r_{ON}$ is the resistance of FET switch 11 when in the conducting state.

Then $V_a = [(r_{ON} + R_1)/R_2]V_{in}$ (2)

and $V_O = [R_1/(R_1 + r_{ON})]V_a$ (3)

Substituting (2) in (3)

$V_O = [R_1/(R_1 + r_{ON})][(r_{ON} + R_1)/R_2]V_{in}$ $V_O = (R_1/R_2)V_{in}$

Thus, the output voltage $V_O$ is independent of the resistance $r_{ON}$ of the FET switch 11.

Figure 2:
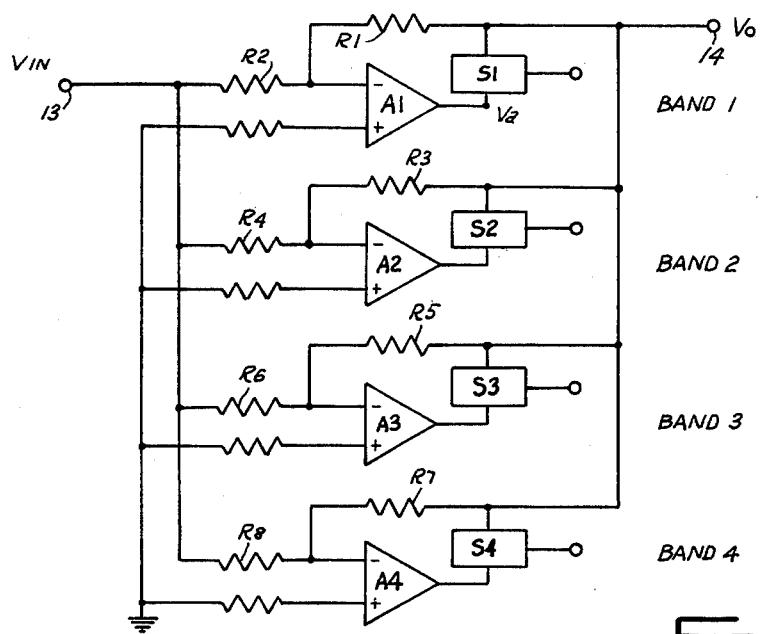
FIG. 2 schematically illustrates in simplified form a typical embodiment of a four-band multiplexed circuit system of the amplifier circuit of FIG. 1; for a typical four-band receiver tuning circuit.

A typical embodiment of a four-band analog multiplexing circuit using the tuning circuit of FIG. 1 is shown in FIG. 2. Operational amplifiers A1–A4 are connected to resistors R2, R4, R6, and R8, respectively, which are connected to input terminal 13 to receive the analog voltage signal $V_{in}$. FET switches S1–S4 are connected through feedback resistors R1, R3, R5, and R7, respectively, in the manner described for FIG. 1. The drain of the switches S1–S4 is connected in common to output terminal 14. The gain of each band for this particular application is shown in the following table:

| Band | Gain | Input ($V_{in}$) | Output ($V_0$) |
|------|------|------------------|----------------|
| 1 | 0.1 | 0→+10V | 0→−1V |
| 2 | 0.2 | 0→+10V | 0→−2V |
| 3 | 0.3 | 0→+10V | 0→−3V |
| 4 | 0.4 | 0→+10V | 0→−4V |

The gain is determined by the ratio of resistors $R_1/R_2$, $R_3/R_4$, $R_5/R_6$, and $R_7/R_8$, respectively, with ratios matched to typically 0.005% and a ratio temperature coefficient of 1 ppm per degree C., in typical embodiments of receiver tuning circuits being generally suitable.

The outputs of the four circuits are electrically connected to a common terminal 14. One amplifier is always closed loop, i.e., gated on by a gating signal on the gate connection of its FET, while the three other amplifiers are open loop. With the inverting inputs no longer virtual ground for the open loop amplifiers, the output voltage $V_O$ is controlled by the one closed loop amplifier. The outputs of the amplifiers are normally clamped to −6.2 volts by Zener diodes. This is illustrated for typical bands 3 and 4 only, as shown by Zener diodes 30, 31, 32, and 33 in the detailed circuits of band 3 and band 4 shown in FIGS. 3 and 4. This will prevent damage to the FET switches S1–S4 when the amplifiers A1–A4 saturate. The outputs of the amplifiers are decoupled from capacitive loading by a 56-ohm resistor, such as resistors 35, 36, 37, and 38 shown in the detailed circuits of bands 3 and 4 in FIGS. 3 and 4. The amplifiers are compensated by external capacitors and are power supply decoupled by a resistor-capacitor network, as is conventional with similar circuits.

Several outputs may be multiplexed in this manner with the limiting factor being the current drive capability of the operational amplifiers being used, since the one closed loop amplifier must drive the feedback networks of all the amplifiers. This problem can be overcome by the conventional addition of current amplifiers on the outputs of the operational amplifiers observing power dissipation constraints of the components. The outputs can also be clamped to a certain voltage by placing a Zener diode on the bandwidth control of the amplifier. For higher voltage applications, two or more FET switches can be connected in series in each band to overcome any breakdown voltage problems that may be encountered, as shown by the series connections of quad FET's U17 and U18 in FIGS. 3 and 4.

With this circuit more stability and accuracy has been obtained than with the prior art circuits.

Figure 3:
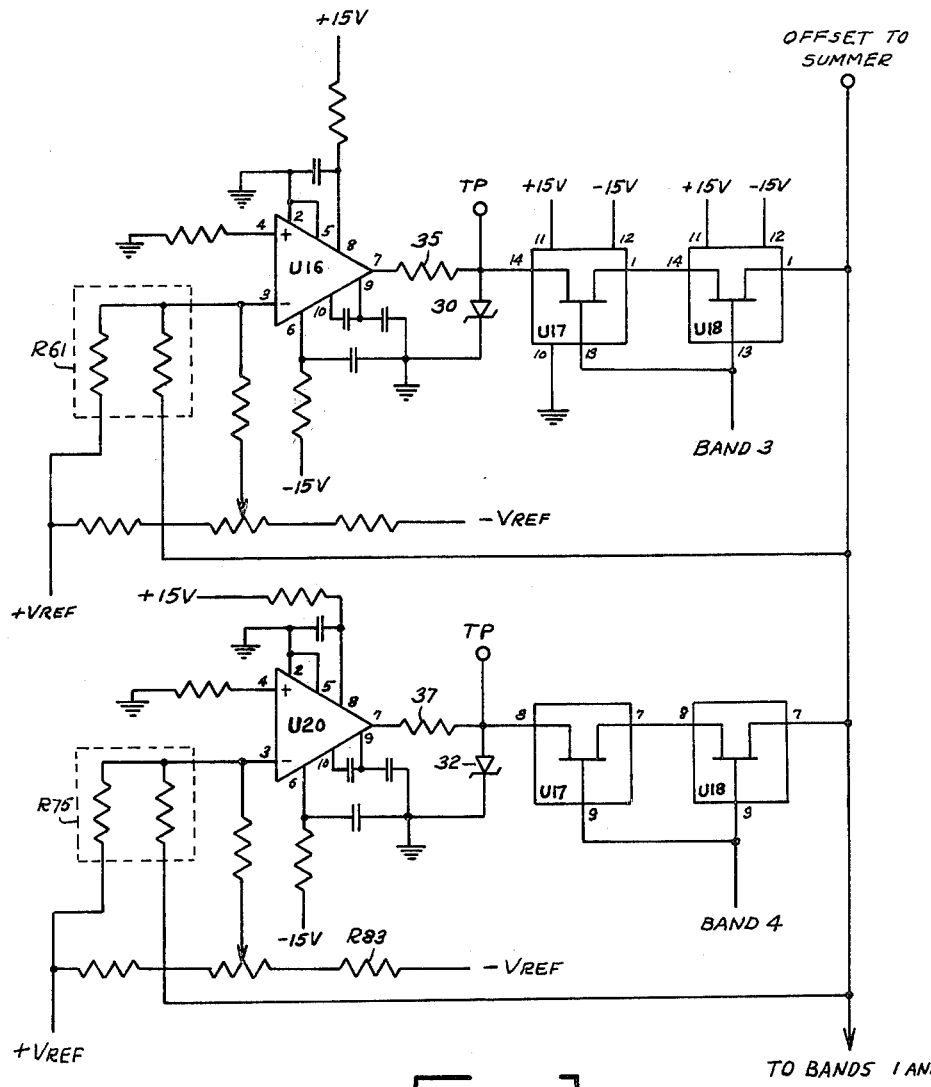
FIG. 3 schematically illustrates a detailed circuit embodiment of typical multiplexed offset amplifiers for band 3 and band 4 of a typical four-band receiver tuning circuit as shown in FIG. 2.
Figure 4:
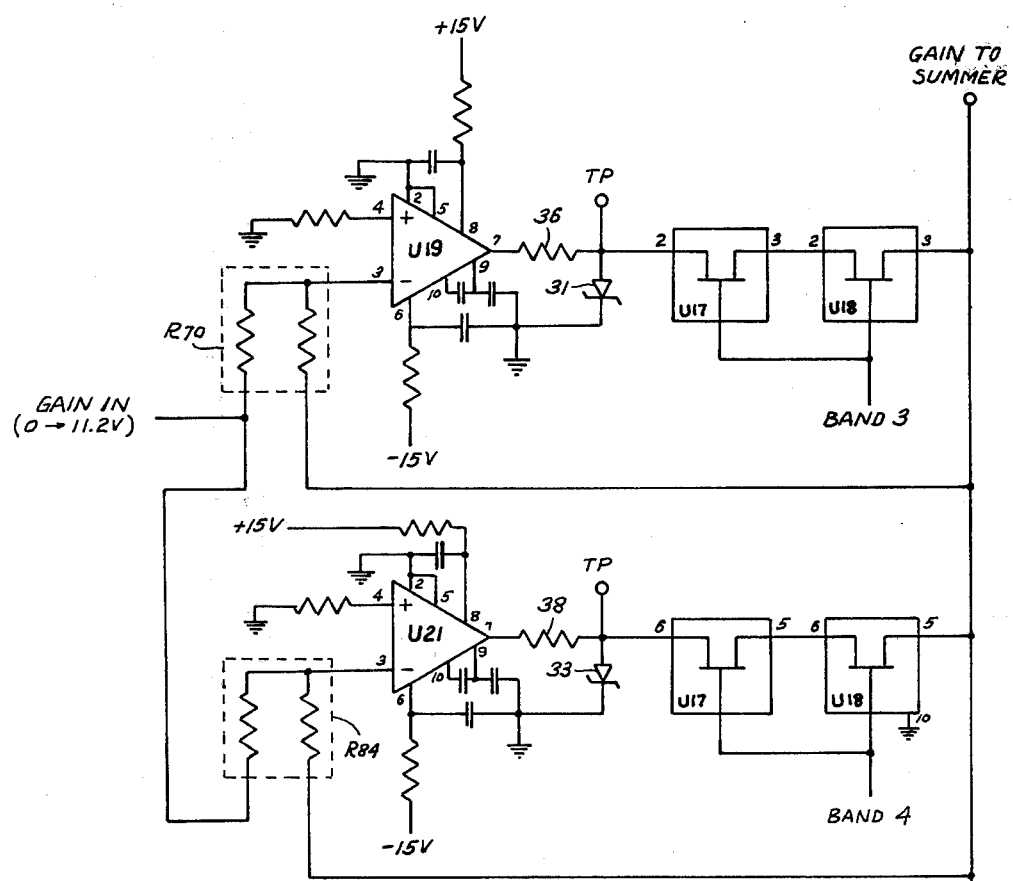
FIG. 4 schematically illustrates a detailed circuit embodiment of typical multiplexed gain amplifiers for band 3 and band 4 of a typical four-band receiver tuning circuit as shown in FIG. 2.

The embodiment of the invention for four bands as illustrated schematically in FIG. 2 is shown in basic form. It comprises a unique circuit for providing more stable and accurate control voltages in a space saving multiplexing circuit for voltage controlled oscillators as are conventionally used in electronic frequency synthesizers. It is well understood that those practicing this invention will implement the circuitry within the common skill and techniques of the art. FIGS. 3 and 4 are presented by way of example to aid those practicing the invention. As previously stated the invention is not limited in multiplexing to four bands as illustrated in the drawing of FIG. 2. Also those practicing the invention will frequently utilize multiple circuits to provide a necessary offset voltage as shown in FIG. 3 which is conventionally summed with the gain voltage as provided by companion multiplexed circuits as illustrated in FIG. 4. The magnitude of the offset voltage is determined by ratio resistor networks R61 and R75 in connection with the potentiometer setting and the input reference voltage $V_{ref}$. Likewise the output gain voltage to the summer in FIG. 4 is determined by the ratio of the resistors in the resistor networks R70 and R84 times the gain input voltage, as previously discussed. Also it is understood that in a conventional typical electronic frequency synthesizer using the improved tuning voltage circuits herein disclosed that many well known conventional logic, binary converter circuits and other conventional circuits will be used to provide the required offset reference voltages and gain levels to embodiments of the invention and that the voltage outputs from embodiments of the invention that have both an offset voltage and a gain voltage for each band will be conventionally summed in respective band summing amplifiers before actuating conventional line drivers in the synthesizer.

I claim:

1. Apparatus having circuit analog signal multiplexing for providing in response to a plurality of sequential respective gate signals a respective plurality of analog tuning voltages that are a determined ratio of a common input voltage comprising:
    a. a plurality of operational amplifiers having an inverting input and an output;
    b. a plurality of field effect transistor (FET) switches in one-to-one correspondence with the said plurality of operational amplifiers, each having a source connection, a drain connection, and a gate connection;
    c. a plurality of first resistors, in one-to-one correspondence with the said plurality of operational amplifiers, each having a first connection and a second connection;
    d. a plurality of second resistors in one-to-one correspondence with the said plurality of operational amplifiers, each having a first connection and a second connection;
    e. means for connecting the respective said output of each of the operational amplifiers to the said source connection of a respective FET;
    f. means for connecting the said drain of each respective FET to a respective said first connection of a respective first resistor;
    g. means for connecting the said second connection of the said respective first resistor to the said inverting input of the said respective operational amplifier;
    h. means for connecting the first connection of each of the said second resistors to the said input voltage and the said second connection of each respective said second resistors to the said inverting input of a respective operational amplifier;
    i. means for connecting the said drain connections of the said plurality of FET switches to a common output;
    j. means for applying the said plurality of sequential respective gate signals to the respective gate connections of the respective FET switches whereby in response to a respective gate signal a respective tuning voltage is provided at the said common output that is equivalent to the ratio of the respective first resistor to the said respective second resistor times the said common input voltage; and
    k. means including a plurality of Zener diodes in one-to-one correspondence with the said plurality of FET switches for clamping the said source of each of the said plurality of FET switches when the operational amplifier of the respective FET is saturated.

* * * * *